(12) United States Patent
Zambrano et al.

(10) Patent No.: US 6,366,488 B1
(45) Date of Patent: Apr. 2, 2002

(54) FERROELECTRIC NON-VOLATILE MEMORY CELL INTEGRATED IN A SEMICONDUCTOR SUBSTRATE

(75) Inventors: Raffaele Zambrano, Viagrande; Chiara Corvasce, Catania, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/561,331

(22) Filed: Apr. 28, 2000

(30) Foreign Application Priority Data

Apr. 30, 1999 (IT) .......................... MI99A0919

(51) Int. Cl.[7] .............................. G11C 11/22

(52) U.S. Cl. ....................... 365/145; 365/149

(58) Field of Search ................. 365/145, 149

(56) References Cited

U.S. PATENT DOCUMENTS 5,903,492 A * 5/1999 Takashima .................. 365/145

* cited by examiner

Primary Examiner—Vu A. Le
(74) Attorney, Agent, or Firm—Lisa Jorgenson; Robert Iannucci; Seed IP Law Group PLLC

(57) ABSTRACT

Presented is a ferroelectric non-volatile memory cell in a semiconductor substrate that has a MOS device connected in parallel to a ferroelectric capacitor. The MOS device has first and second conduction terminals and is covered with an insulating layer. The ferroelectric capacitor has a lower electrode formed on the insulating layer above the first conduction terminals and are electrically coupled to them. The lower electrode of the ferroelectric capacitor is covered with a layer of ferroelectric material and coupled capacitively to an upper electrode. The upper electrode is formed above the second conduction terminals and are electrically connected thereto, and extends over the ferroelectric material to at least partially overlap the lower electrode. Also presented is a non-volatile memory matrix that includes a plurality of the ferroelectric memory cells that are organized into rows and columns.

13 Claims, 3 Drawing Sheets

FERROELECTRIC NON-VOLATILE MEMORY CELL INTEGRATED IN A SEMICONDUCTOR SUBSTRATE

TECHNICAL FIELD

This invention relates to a ferroelectric non-volatile memory cell, and, more specifically, the invention relates to ferroelectric non-volatile memory cells that are used in a serial configuration, and that have a stacked-type structure that includes a MOS device connected in parallel to a ferroelectric capacitor.

BACKGROUND OF THE INVENTION

Semiconductor integrated ferroelectric electronic non-volatile memory devices comprise a plurality of ferroelectric non-volatile memory cells organized into a matrix, that is, laid into rows or wordlines and columns or bitlines.

Each ferroelectric non-volatile memory cell comprises a MOS transistor and a ferroelectric capacitor.

Conventionally, the processes for fabricating these memory cells includes, once the MOS transistor is integrated into a semiconductor substrate, forming an insulating layer over the entire chip surface.

The ferroelectric capacitor is then formed on top of this insulating layer. This capacitor has conventionally a lower electrode of metal disposed on the insulating layer.

A layer of ferroelectric material covers the lower electrode, and an upper electrode of metal is disposed on the ferroelectric layer.

Ferroelectric cells can be classed basically according to two configurations, namely a strapped or a stacked configuration.

In the former instance, the capacitor is formed outside the active area of the transistor and is connected to the latter by a metal interconnection between a conduction electrode of the transistor and one electrode of the ferroelectric capacitor.

In the latter instance, the ferroelectric capacitor is formed in the active area of the transistor and connected to the latter by a buried contact connecting a conduction electrode of the transistor to the lower electrode of the ferroelectric capacitor.

In this "stacked" configuration, the dimensions of the ferroelectric capacitor are material to a cell area optimization, since this is the configuration that is regarded most appropriate to fill the demands for integration of new CMOS technologies.

However, including special metallizations for the connections between adjacent cells in the same column BL in the matrix increases the size of the memory matrix, and requires process steps otherwise unnecessary.

SUMMARY OF THE INVENTION

Embodiments of the invention provide ferroelectric non-volatile memory cells with such constructional and functional features as to allow improved integration to CMOS devices and overcome the drawbacks with which prior memory cells are still beset.

Presented is a device that includes a semiconductor substrate having a ferroelectric non-volatile memory cell which includes a MOS transistor and a ferroelectric capacitor. The ferroelectric capacitor has electrodes connected directly between the conduction terminals of the MOS transistor. The upper electrode of the ferroelectric capacitor is formed above the second conduction terminals of two adjacent MOS transistor and connected electrically thereto, and is arranged to extend over the ferroelectric material to at least partially overlap the lower electrode. Also presented is a non-volatile memory matrix that includes a plurality of the ferroelectric memory cells that are organized into rows and columns, as well as methods for forming both the memory cells and the memory matrix.

The features and advantages of the structure of a memory cell according to the invention will be apparent from the following description of an embodiment thereof depicting memory cells of the ferroelectric type being arranged in a stacked type of structure and used in a serial configuration, and the ensuing description will make reference to this application field for convenience of illustration only.

DETAILED DESCRIPTION OF THE INVENTION

Figure 1:
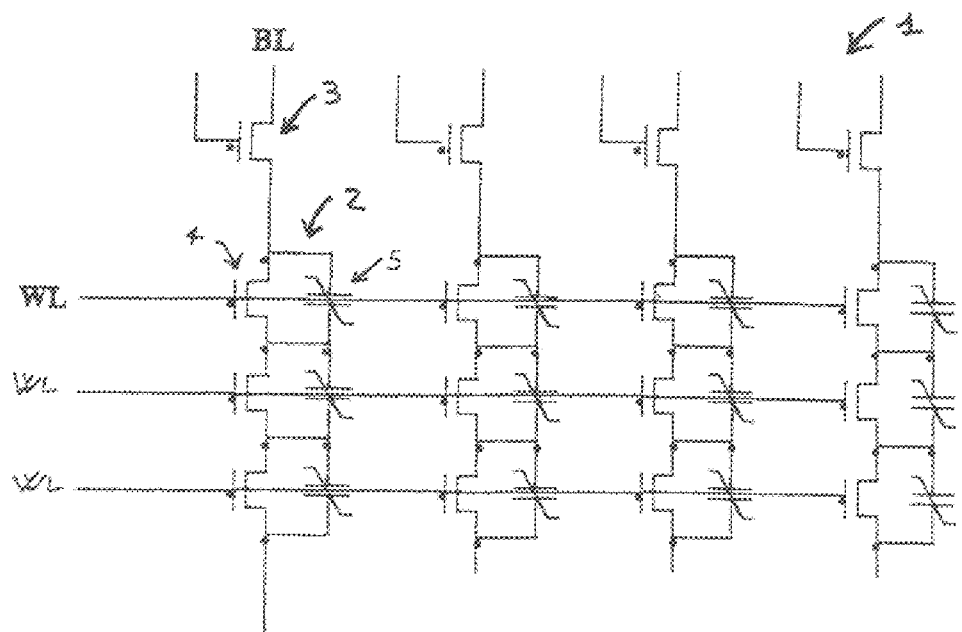
FIG. 1 is a schematic diagram of a portion of a memory matrix which comprises a plurality of ferroelectric memory cells of the serial type.

A ferroelectric memory cell according to this invention will now be described with reference to the drawing views. Directional language such as "above," "below," "in front" and "behind" are used in conjunction with one orientation of the described devices, and maintain their relative bearings no matter which particular orientation the described devices sit. Discussion of processes or structures well known to those skilled in the art has been abbreviated or eliminated for brevity.

FIG. 1 shows a schematic diagram for an integrated electronic circuit which incorporates a memory matrix 1 of the serial type comprising a plurality of nonvolatile ferroelectric memory cells 2 and plural addressing and decoding devices for selection 3.

Each memory cell 2 comprises a MOS transistor 4 having a ferroelectric capacitor 5 parallel-connected thereto. More particularly, the ends of the ferroelectric capacitor are respectively connected to the conduction terminals of the transistor 4.

The memory matrix 1 comprises memory cells 2 that are organized into rows (wordlines) WL and columns (bitlines) BL, as well as selection devices 3.

The plurality of memory cells 2 are identified at the intersections of the bitlines and the wordlines.

Figure 2:
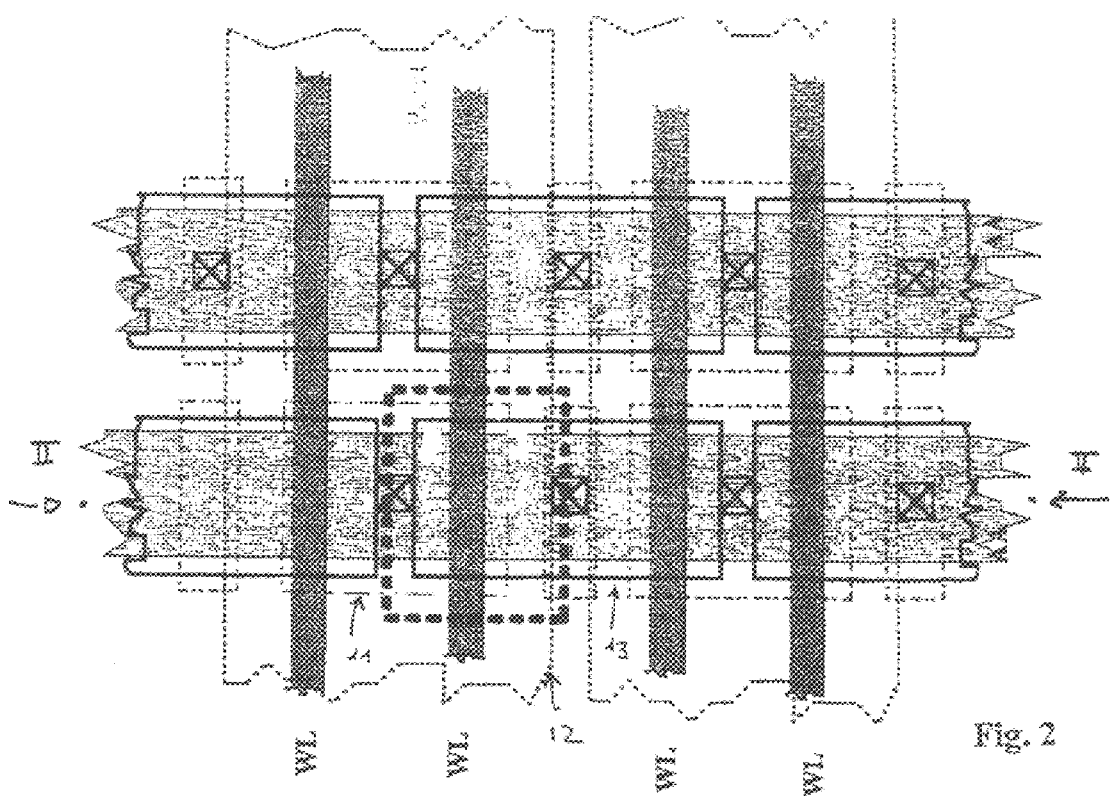
FIG. 2 is a top plan view of a portion of a semiconductor substrate accommodating a plurality of serial ferroelectric memory cells in an integrated form, according to an embodiment of the invention.
Figure 3:
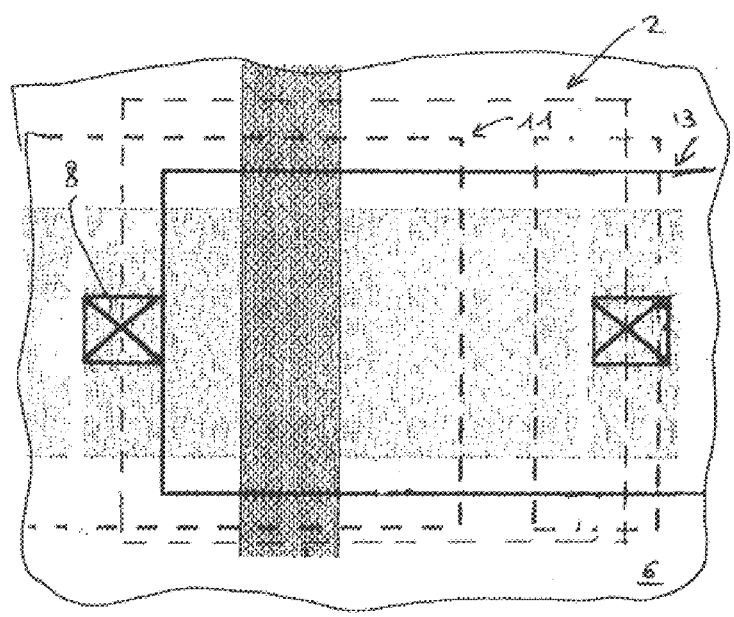
FIG. 3 is an enlarged top plan view of a portion of a semiconductor substrate wherein a single ferroelectric memory cell of the serial type is provided in an integrated form, according to another embodiment of the invention.

FIGS. 2 and 3 show, schematically to an enlarged scale and as viewed from above, an embodiment of a portion of a serial memory matrix 1 comprising a plurality of ferroelectric non-volatile memory cells 2 integrated in a semiconductor substrate 6, as well as an individual non-volatile memory cell, respectively.

Figure 4:
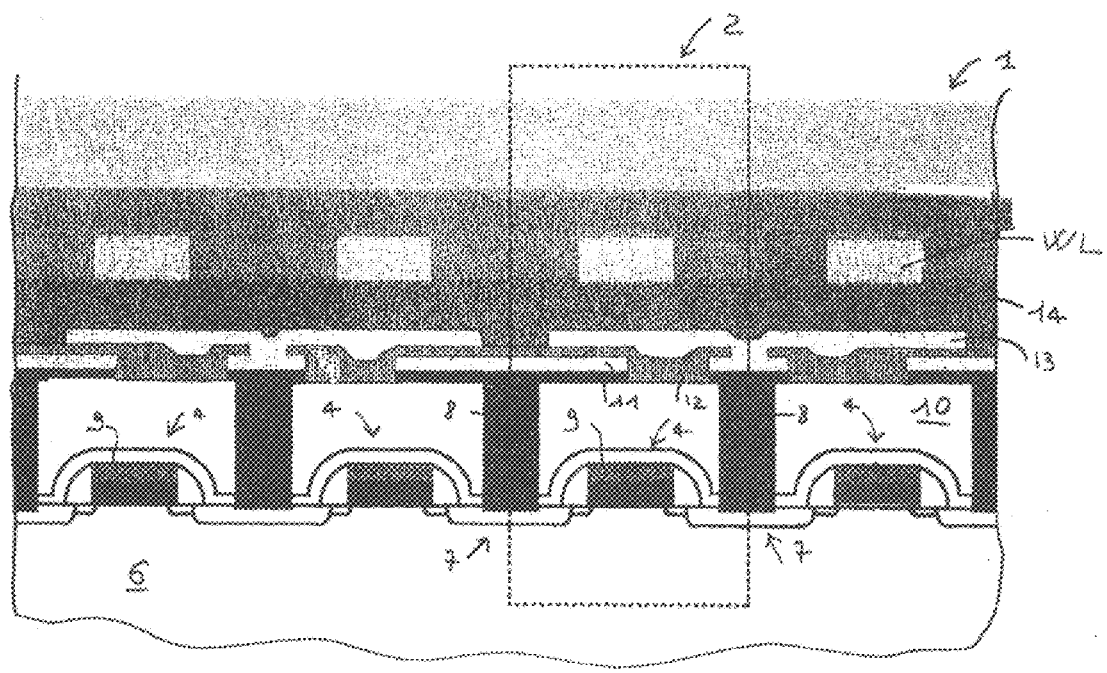
FIG. 4 is a cross-sectional view of FIG. 2, taken along a line II—II.

Referring to FIG. 4, which shows a cross-section along the II—II line of FIG. 2, shown is a series of MOS transistors 4 formed in the semiconductor substrate 6. As those skilled in the art will recognize, each MOS transistor 4 has first and second conduction terminals 7, formed in respective source and drain regions of the substrate 6 for the transistor 4.

A gate (or control) polysilicon electrode 9 overlies the substrate region extending between the conduction terminal pair 7, and is isolated from the surface of the substrate 6 by a thin oxide layer.

In this serial configuration, adjacent transistors 4 in the same column BL have a conduction terminal in common.

An insulating layer 10, e.g., of doped oxide with boron and phosphorus (BPSG), is then formed over the entire semiconductor surface.

Openings are made through the insulating layer 10 at the locations of the conduction terminals to conventionally provide respective contacts 8.

Advantageously in this embodiment, ferroelectric capacitors 5 are provided at each MOS transistor 4. Each ferroelectric capacitor 5 has a lower electrode 11 of a metal such as platinum disposed on the insulating layer 10 at the locations of the first conduction terminals 7. Advantageously, the lower electrode 11 overlaps the control electrode 9 at least in part.

A layer 12 of ferroelectric material covers the lower electrode 11. Advantageously, the layer 12 of ferroelectric material should cover the entire surface of the semiconductor.

In this case, openings are then defined through the ferroelectric material layer 12 above the second conduction terminals.

Thereafter, an upper electrode 13 of a metal such as platinum is disposed on said layer 12 of ferroelectric material.

The upper electrode 13 is patterned to partially overlap two lower electrodes 11 of adjacent cells 5 and contact the second conduction terminals 8.

Thus, a plurality of ferroelectric memory cells 2 are formed, each comprising a MOS transistor 4 with a ferroelectric capacitor 5 connected in parallel.

Subsequently to the above, the memory matrix 1 is completed conventionally with the deposition of an insulating layer 14.

In conclusion, the ferroelectric memory cell structure of this invention obviates the need to have metallizations formed in the matrix, the connections between adjacent cells in the same column BL being provided by local interconnections using the electrodes of the ferroelectric capacitor.

This structure offers improved integration of the ferroelectric capacitors to the CMOS devices by that substantially a single contact element 8 is provided for each of the cells 2.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A ferroelectric non-volatile memory cell integrated in a semiconductor substrate, comprising:

a MOS device having first and second conduction terminals and being covered with an insulating layer; and a ferroelectric capacitor connected in parallel to said MOS device, the ferroelectric capacitor having a lower electrode formed on said insulating layer above said first conduction terminal and in electrical connection therewith, said lower electrode being covered with a layer of ferroelectric material and coupled capacitively to an upper electrode that is formed above said second conduction terminal and electrically connected thereto, and that extends over said ferroelectric material to at least partially overlap said lower electrode, wherein said layer of ferroelectric material overlies a portion of said insulating layer laterally of said lower electrode.

2. The ferroelectric non-volatile memory cell according to claim 1 wherein said lower electrode at least partially overlaps a control electrode of said MOS device.

3. The ferroelectric non-volatile memory cell according to claim 1, further comprising a contact element provided for the cell.

4. A non-volatile memory matrix comprising a plurality of ferroelectric memory cells integrated in a semiconductor substrate and organized into a plurality of rows and columns, each cell comprising:

a MOS device having first and second conduction terminals and being covered with an insulating layer; and a ferroelectric capacitor coupled in parallel to said MOS device, the ferroelectric capacitor having a lower electrode formed on said insulating layer, above said first conduction terminals and in electrical connection therewith, said lower electrode being covered with a layer of ferroelectric material and coupled capacitively to an upper electrode that is formed above said second conduction terminals and electrically connected thereto, and extends over the ferroelectric material to at least partially overlap the lower electrode, wherein the layer of ferroelectric material lies on a portion of the insulating layer laterally of the lower electrode.

5. The ferroelectric memory matrix according to claim 4 wherein each upper electrode at least partially overlaps the lower electrodes of two adjacent cells in a same column.

6. The ferroelectric memory matrix according to claim 4 wherein the lower electrode at least partially overlaps a control electrode of said MOS device.

7. The ferroelectric non-volatile memory matrix according to claim 4 wherein a contact element is provided for each cell.

8. A plurality of ferroelectric non-volatile memory cells in a semiconductor substrate, the cells arranged in a matrix of rows and columns, each cell comprising:

a MOS transistor formed in the semiconductor substrate, the MOS transistor having first and second conduction terminals and a gate terminal;

an insulating layer formed over the MOS transistor;

first and second contacts respectively coupled to the first and second conduction terminals through openings in the insulating layer, the first and second contacts extending away from the substrate to a level substantially planar with the insulating layer; and a ferroelectric capacitor having a first electrode, a second electrode, and a ferroelectric material, the first electrode being formed on the insulating layer and electrically coupled to the first contact, the ferroelectric material covering at least a portion of the first electrode and the second electrode including a first portion positioned laterally of the first electrode and coupled to the second contact, and a second portion extending across at least a portion of the ferroelectric material above the first contact, wherein the ferroelectric material also extends laterally between the first electrode and the first portion of the second electrode.

9. The plurality of ferroelectric non-volatile memory cells according to claim 8, wherein two immediately adjacent cells in a given column share either the first or the second contact.

10. The plurality of ferroelectric non-volatile memory cells according to claim 8 wherein, in at least one cell, the first electrode of the ferroelectric capacitor at least partially overlaps the gate terminal of the MOS transistor.

11. The plurality of ferroelectric non-volatile memory cells according to claim 8 wherein the second electrode of the ferroelectric capacitor in a first memory cell also at least partially overlaps the first electrode of a second memory cell that is adjacent to the first memory cell in a same column.

12. The ferroelectric non-volatile memory cell according to claim 3, wherein the contact element is shared between two adjacent cells.

13. The ferroelectric non-volatile memory matrix according to claim 7, wherein the contact element is shared between two adjacent cells.

* * * * *